United States Patent
Taylor et al.

(10) Patent No.: US 7,605,581 B2
(45) Date of Patent: Oct. 20, 2009

(54) APPARATUS AND METHOD FOR CONTROLLING DIE FORCE IN A SEMICONDUCTOR DEVICE TESTING ASSEMBLY

(75) Inventors: Troy Taylor, Poway, CA (US); Steve Wetzel, Poway, CA (US)

(73) Assignee: Delta Design, Inc., Poway, CA (US)

( * ) Notice: Subject to any disclaimer, the term of this patent is extended or adjusted under 35 U.S.C. 154(b) by 0 days.

(21) Appl. No.: 11/454,122

(22) Filed: Jun. 16, 2006

(65) Prior Publication Data

US 2007/0013385 A1    Jan. 18, 2007

Related U.S. Application Data

(60) Provisional application No. 60/690,907, filed on Jun. 16, 2005.

(51) Int. Cl.
*H01L 23/46* (2006.01)
*H01L 23/467* (2006.01)
*H01L 23/473* (2006.01)

(52) U.S. Cl. .................................. 324/158.1
(58) Field of Classification Search ................ 361/382, 361/385; 324/760
See application file for complete search history.

(56) References Cited

U.S. PATENT DOCUMENTS

| | | | | |
|---|---|---|---|---|
| 2,065,086 A * | 12/1936 | May ........................... | 137/382 |
| 3,766,834 A * | 10/1973 | Kraemer ........................ | 92/35 |
| 3,800,191 A | 3/1974 | Newton | |
| 4,561,040 A * | 12/1985 | Eastman et al. ............. | 361/699 |
| 4,729,060 A * | 3/1988 | Yamamoto et al. .......... | 361/700 |
| 4,748,495 A * | 5/1988 | Kucharek .................... | 257/713 |
| 4,748,866 A * | 6/1988 | Weyer ..................... | 74/424.92 |
| 4,759,403 A * | 7/1988 | Flint et al. .................. | 165/80.4 |
| 4,783,721 A * | 11/1988 | Yamamoto et al. .......... | 361/689 |
| 4,910,642 A * | 3/1990 | Downing .................... | 361/690 |
| 4,920,574 A | 4/1990 | Yamamoto et al. | |
| 5,050,037 A | 9/1991 | Yamamoto et al. | |
| 5,290,710 A * | 3/1994 | Haj-Ali-Ahmadi et al. ..... | 438/15 |
| 5,329,419 A | 7/1994 | Umezawa | |
| 5,365,400 A * | 11/1994 | Ashiwake et al. ........... | 361/752 |
| 5,373,417 A | 12/1994 | Barrett | |
| 5,805,430 A | 9/1998 | Atwood et al. | |
| 5,847,366 A * | 12/1998 | Grunfeld .................... | 219/497 |
| 5,944,093 A | 8/1999 | Viswanath | |
| 5,999,407 A | 12/1999 | Meschter et al. | |
| 6,173,760 B1 * | 1/2001 | Gardell et al. ............. | 165/80.4 |
| 6,212,070 B1 | 4/2001 | Atwood et al. | |

(Continued)

FOREIGN PATENT DOCUMENTS

EP    1 455 388 A1    9/2004

(Continued)

*Primary Examiner*—Paresh Patel
(74) *Attorney, Agent, or Firm*—Foley & Lardner LLP

(57) ABSTRACT

A semiconductor device test assembly includes a heat sink having a surface configured to support a device under test, an inner bellow, an outer bellow at least partially surrounding the inner bellow, and a fluid channel within the inner bellow for providing a fluid to the heat sink. The semiconductor device test assembly can further include an air adjustment unit for adjusting an air pressure in the outer bellow, so as to adjust a contact force between the heat sink and the device under test.

27 Claims, 12 Drawing Sheets

U.S. PATENT DOCUMENTS

| | | |
|---|---|---|
| 6,259,602 B1 | 7/2001 | Mälhammar |
| 6,268,995 B1 | 7/2001 | Beuerman et al. |
| 6,301,107 B1 | 10/2001 | Lev et al. |
| 6,356,445 B1 | 3/2002 | Mochzuki et al. |
| 6,411,513 B1 | 6/2002 | Bedard |
| 6,473,289 B1 | 10/2002 | Weisse et al. |
| 6,549,407 B1 | 4/2003 | Sauciuc et al. |
| 7,100,389 B1 * | 9/2006 | Wayburn et al. ............ 62/259.2 |
| 2001/0040029 A1 | 11/2001 | Davenport et al. |
| 2003/0090873 A1 | 5/2003 | Ohkouchi |
| 2004/0052052 A1 | 3/2004 | Rivera |
| 2004/0240184 A1 | 12/2004 | Rivera |

FOREIGN PATENT DOCUMENTS

| | | |
|---|---|---|
| FR | 2 204 887 | 5/1974 |
| WO | WO 91/18426 | 11/1991 |
| WO | WO 2004008053 A1 * | 1/2004 |
| WO | WO 2006138655 A2 * | 12/2006 |

\* cited by examiner

APPARATUS AND METHOD FOR CONTROLLING DIE FORCE IN A SEMICONDUCTOR DEVICE TESTING ASSEMBLY

CROSS-REFERENCE TO RELATED PATENT APPLICATIONS

Embodiments of the present invention relate to U.S. Provisional Application Ser. No. 60/690,907, filed Jun. 16, 2005, entitled "Programmable Die Force Bellows Assembly", the contents of which are incorporated by reference herein and which is a basis for a claim of priority.

BACKGROUND OF THE INVENTION

1. Field of the Invention

Embodiments of the present invention relate generally to a semiconductor device testing assembly and, more particularly, to a system and method for controlling a die force in a semiconductor device testing assembly.

2. Related Art

When testing a semiconductor device, there is a force between a heat sink and the device. This contact force, which can also be referred to as a die force, is provided to ensure that there is a proper heat transfer between the heat sink and the device during testing. The contact force is also limited to ensure that it does not damage the device under test. A conventional semiconductor device testing assembly is designed for testing devices that have tolerances within a range suitable for the contact force provided by the assembly. If the device under test does not have a suitable tolerance range, then a different assembly must be used or the assembly must be customized by changing mechanical parts of the assembly so that the contact force does not damage the device under test.

SUMMARY OF THE DISCLOSURE

A semiconductor device test assembly includes a heat sink having a surface configured to support a device under test, an inner bellow, an outer bellow at least partially surrounding the inner bellow, and a fluid channel within the inner bellow for providing a fluid to the heat sink. The semiconductor device test assembly can further include an air adjustment unit for adjusting an air pressure in the outer bellow, so as to adjust a contact force between the heat sink and the device under test.

DETAILED DESCRIPTION OF PREFERRED EMBODIMENTS

Figure 1:
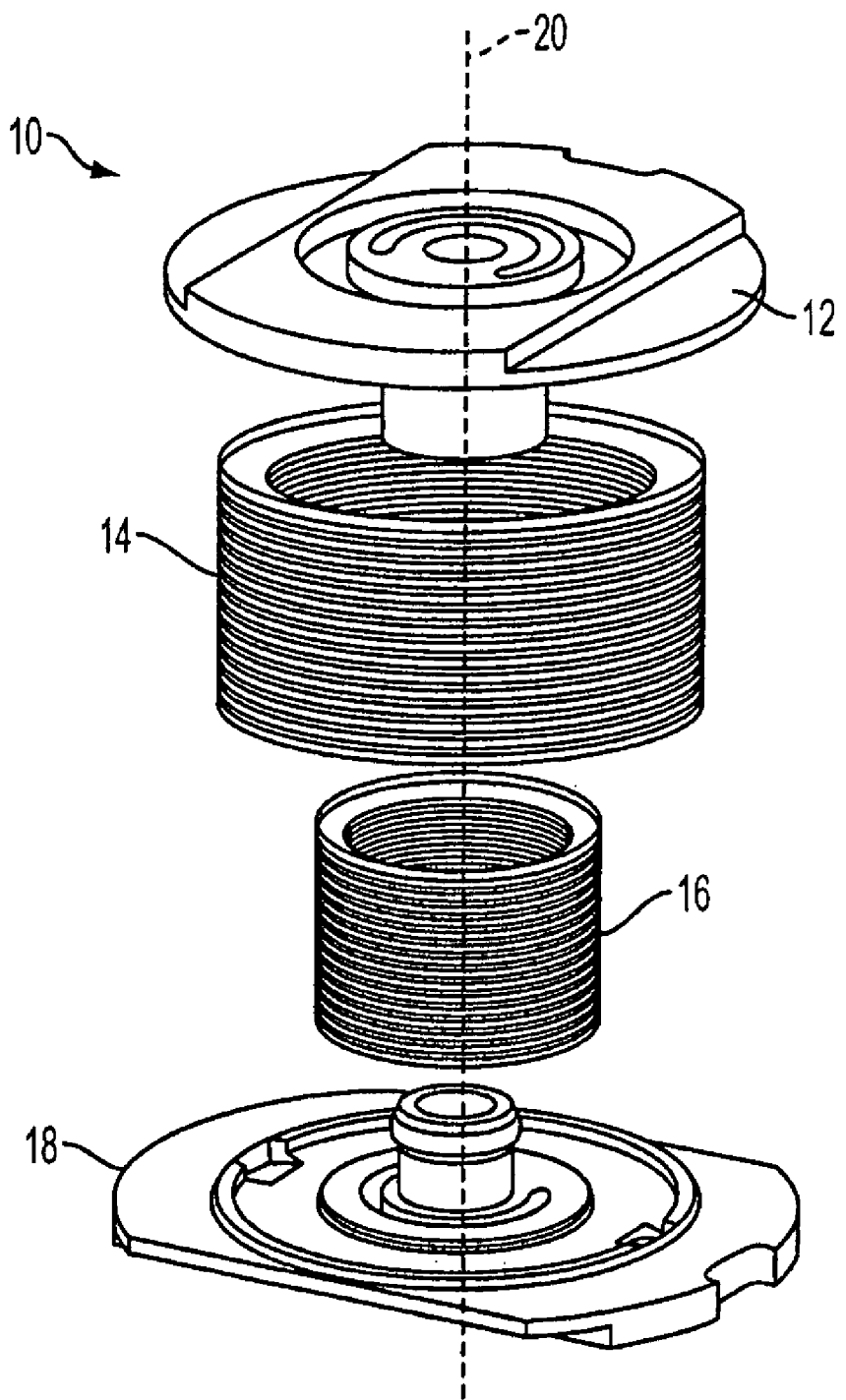
FIG. 1 shows a perspective view of a bellows assembly in accordance with an embodiment of the present invention.
Figure 2:
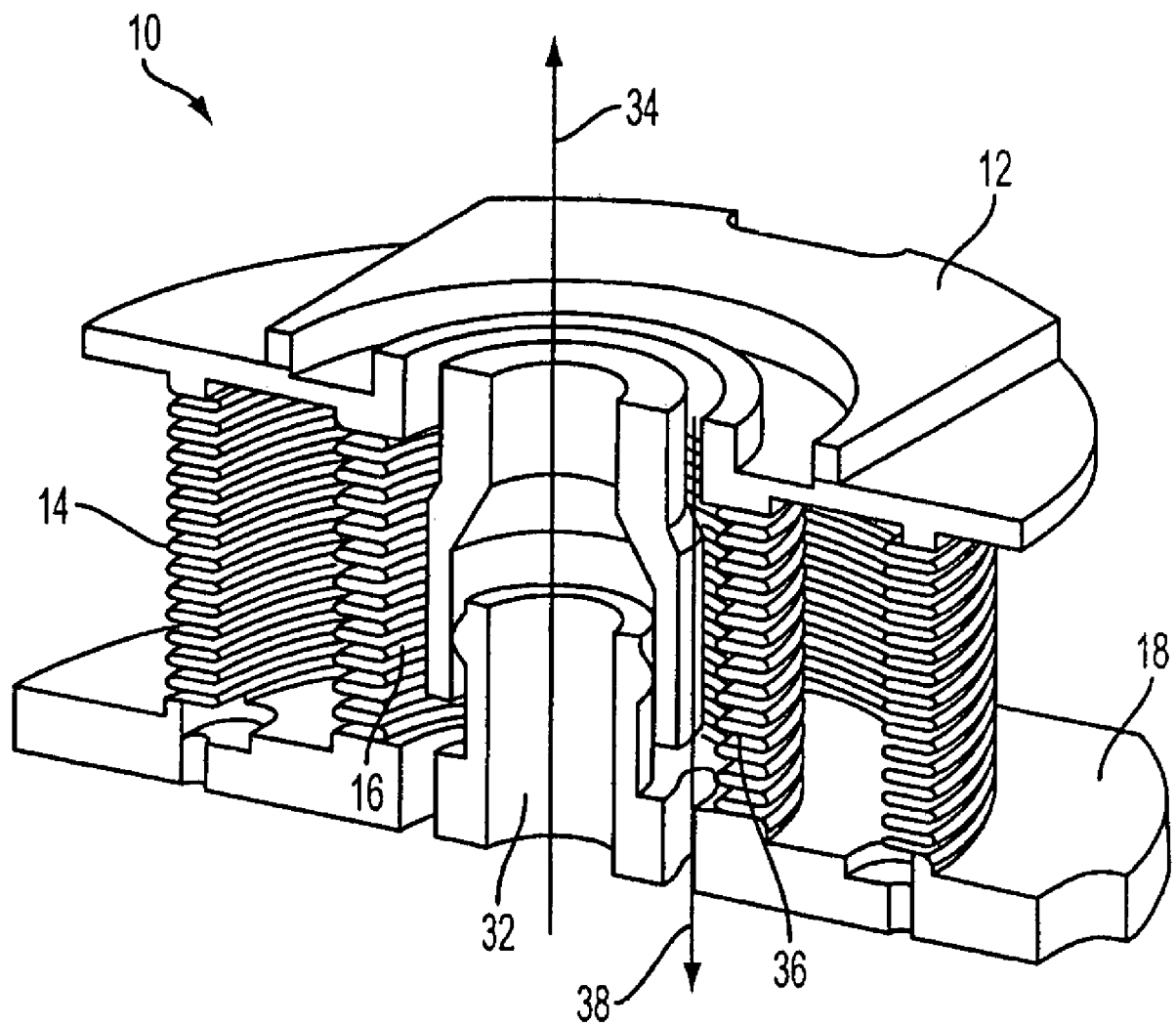
FIG. 2 shows a perspective view of a section of a bellows assembly in accordance with an embodiment of the present invention.
Figure 3:
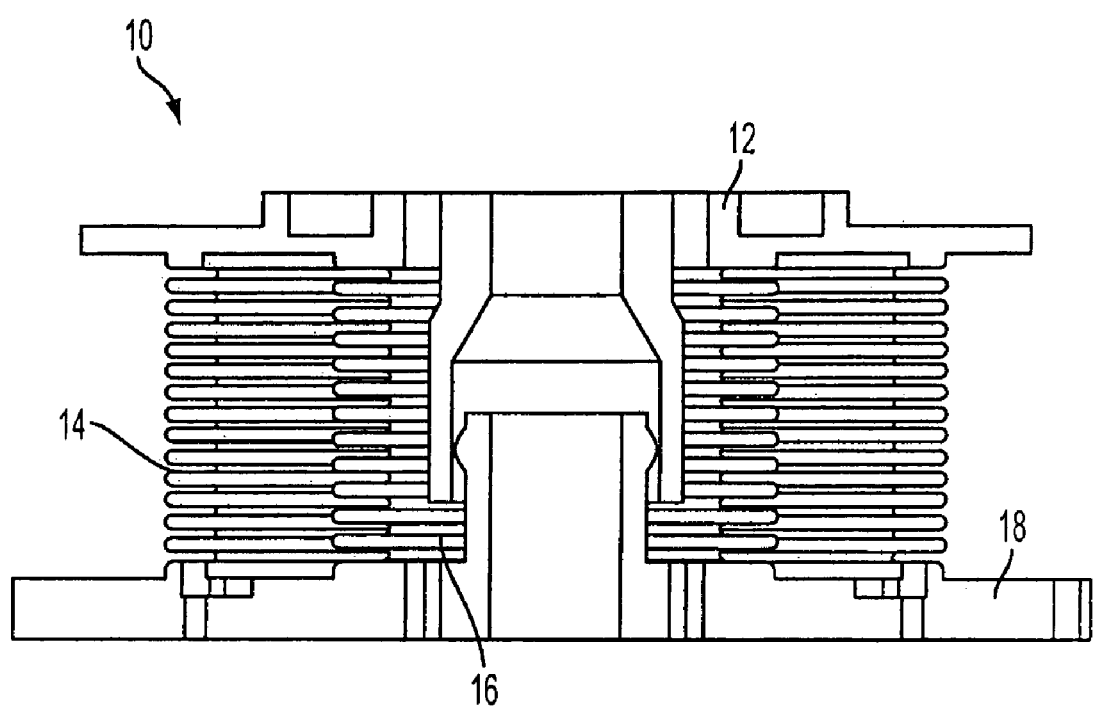
FIG. 3 shows a side view of a section of a bellows assembly in accordance with an embodiment of the present invention.

FIG. 1 shows a perspective view of components of a bellows assembly 10 in accordance with an embodiment of the present invention. FIG. 2 shows a perspective view of a section of the bellows assembly 10. FIG. 3 shows a side view of a section of the bellows assembly 10. As shown in FIG. 1, the bellows assembly 10 includes a top bellow plate 12, an outer bellow 14, an inner bellow 16, and a bottom bellow plate 18. Each of these components are preferably aligned along a central axis 20 such that the inner bellow 16 is inside the outer bellow 14 and such that the inner bellow 16 and the outer bellow 14 are concentric.

As shown in FIG. 2, a central fluid channel 32 and a return fluid channel 36 are preferably located within the inner bellow 16. In one embodiment, a thermal medium, such as a fluid or the like, is provided to a heat sink (not shown in FIG. 2) via the central fluid channel 32 as indicated by the arrow 34, and the thermal medium is provided from the heat sink via the return fluid channel 36 defined between the inner bellow 16 and the central fluid channel 32 as indicated by the arrow 38.

Figure 4:
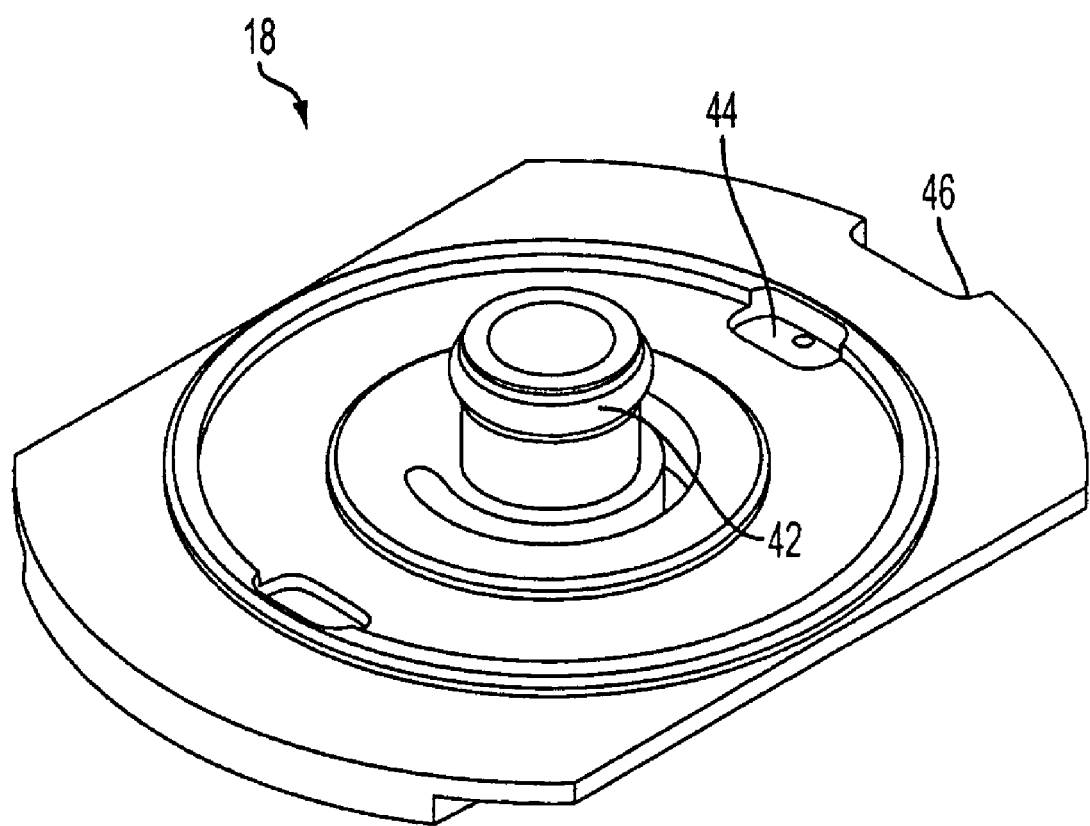
FIG. 4 shows a perspective view of a bottom bellow plate of a bellows assembly in accordance with an embodiment of the present invention.
Figure 5:
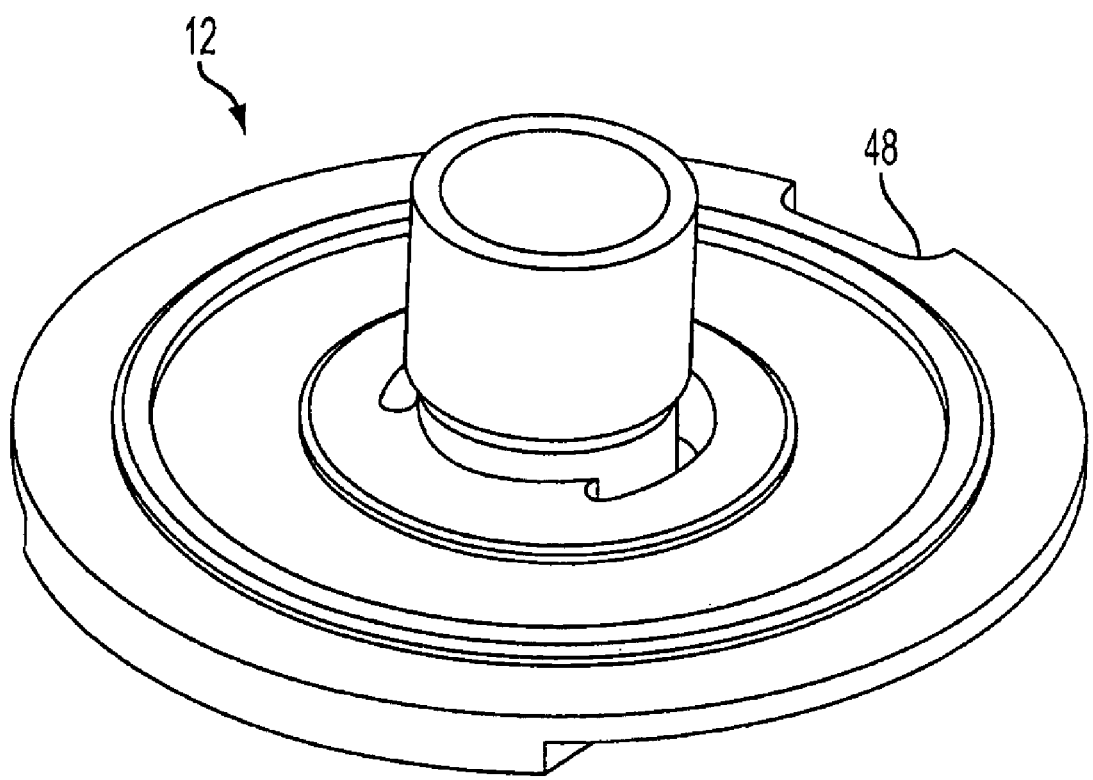
FIG. 5 shows a perspective view of a top bellow plate of a bellows assembly in accordance with an embodiment of the present invention.

FIG. 4 shows a perspective view of the bottom bellow plate 18 of the bellows assembly 10 of FIG. 1. The bottom bellow plate 18 preferably includes a bypass limiting nub 42 and a cutout 44 to prevent solder flow into a die pressure port. The bottom bellow plate 18 can also include an assembly key feature 46 to help ensure proper alignment within a semiconductor device test assembly. FIG. 5 shows a perspective view of the top bellow plate 12 of the bellows assembly 10 of FIG. 1. The top bellow plate 12 can include an assembly key feature 48 to help ensure proper alignment within a semiconductor device test assembly.

Figure 6:
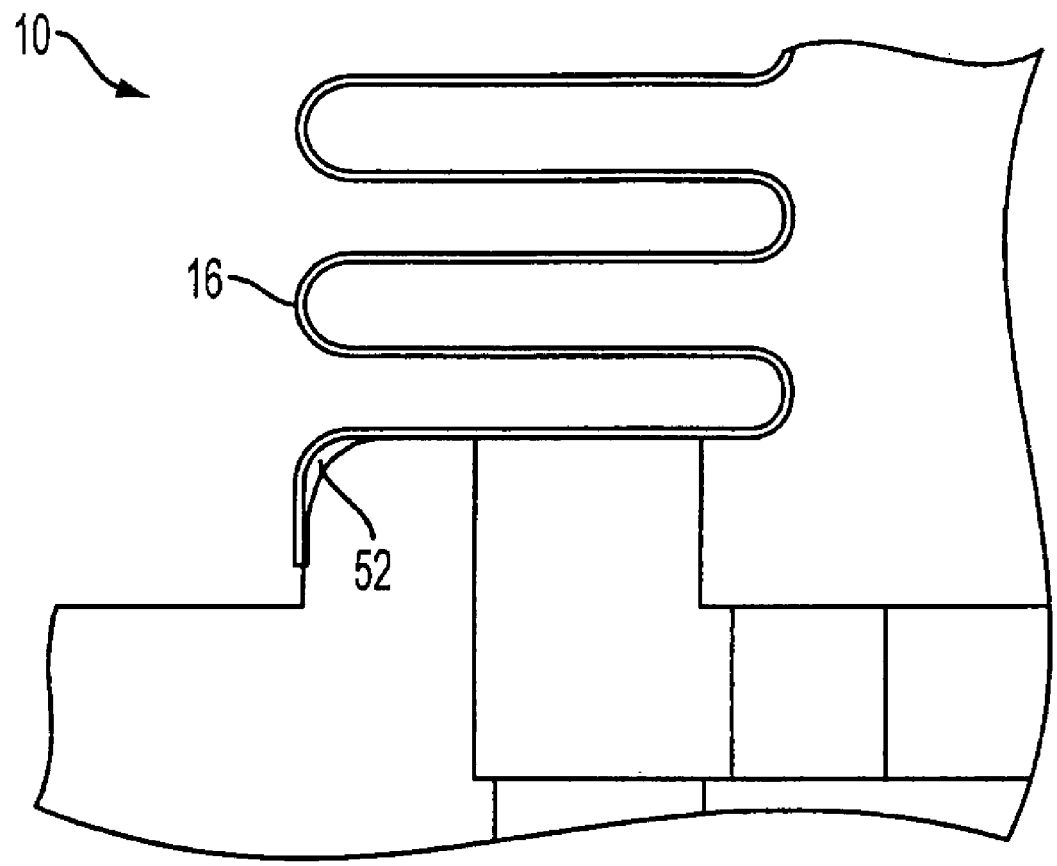
FIG. 6 shows a portion of a bellows assembly in accordance with an embodiment of the present invention.

FIG. 6 shows a portion of the bellows assembly 10 in which the inner bellow 16 has been soldered to the bottom bellow plate 18 at the solder joint 52 in accordance with an embodiment of the present invention. FIG. 3 shows the bellows assembly 10 after the inner bellow 16 has been soldered or otherwise attached to the bottom bellow plate 18. In various other embodiments, the inner bellow 16 can be attached to the bottom bellow plate 18 by other attachment means, such as glue, screws, or the like.

Figure 7:
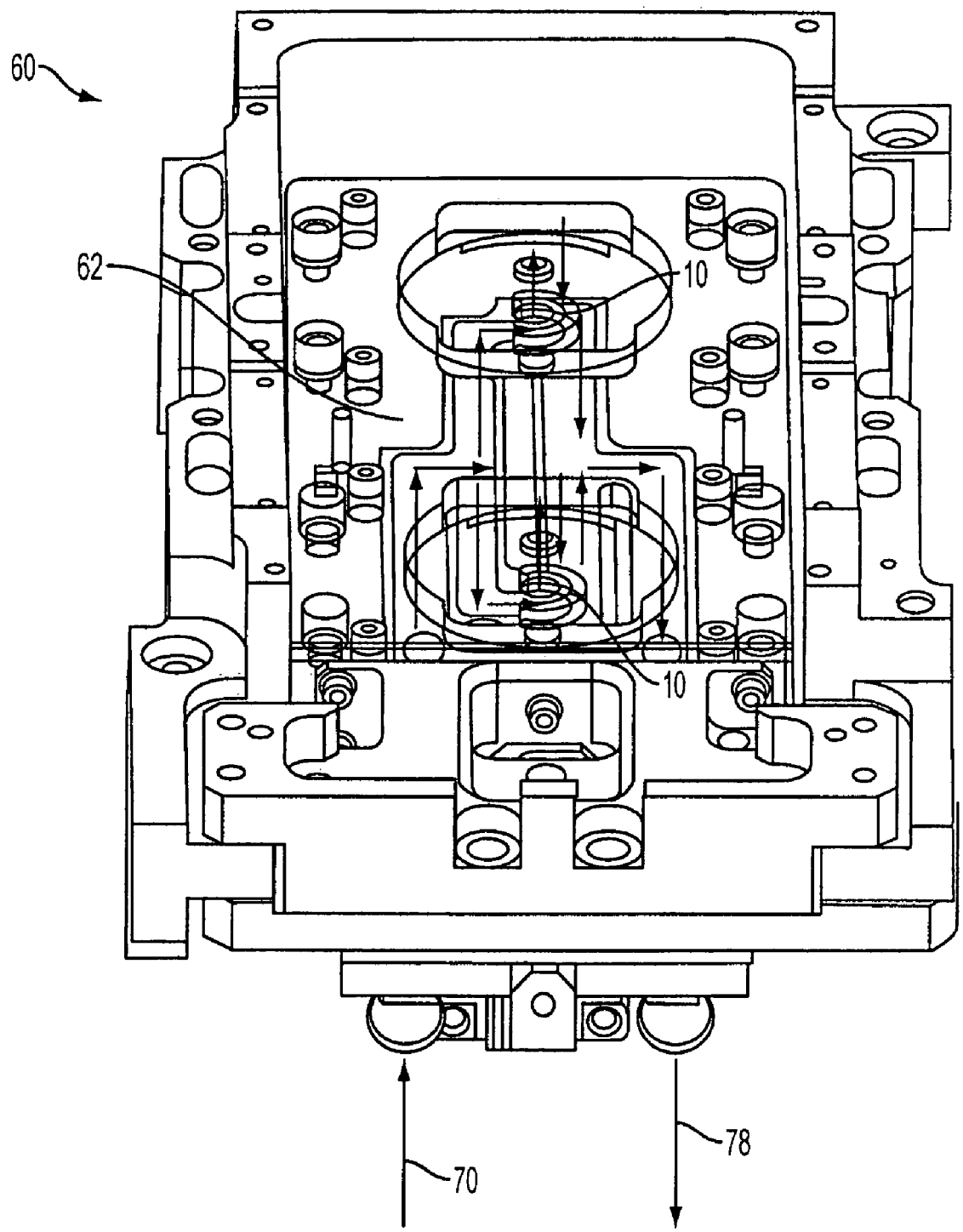
FIG. 7 shows a perspective view of a portion of a semiconductor device test assembly in accordance with an embodiment of the present invention.
Figure 8:
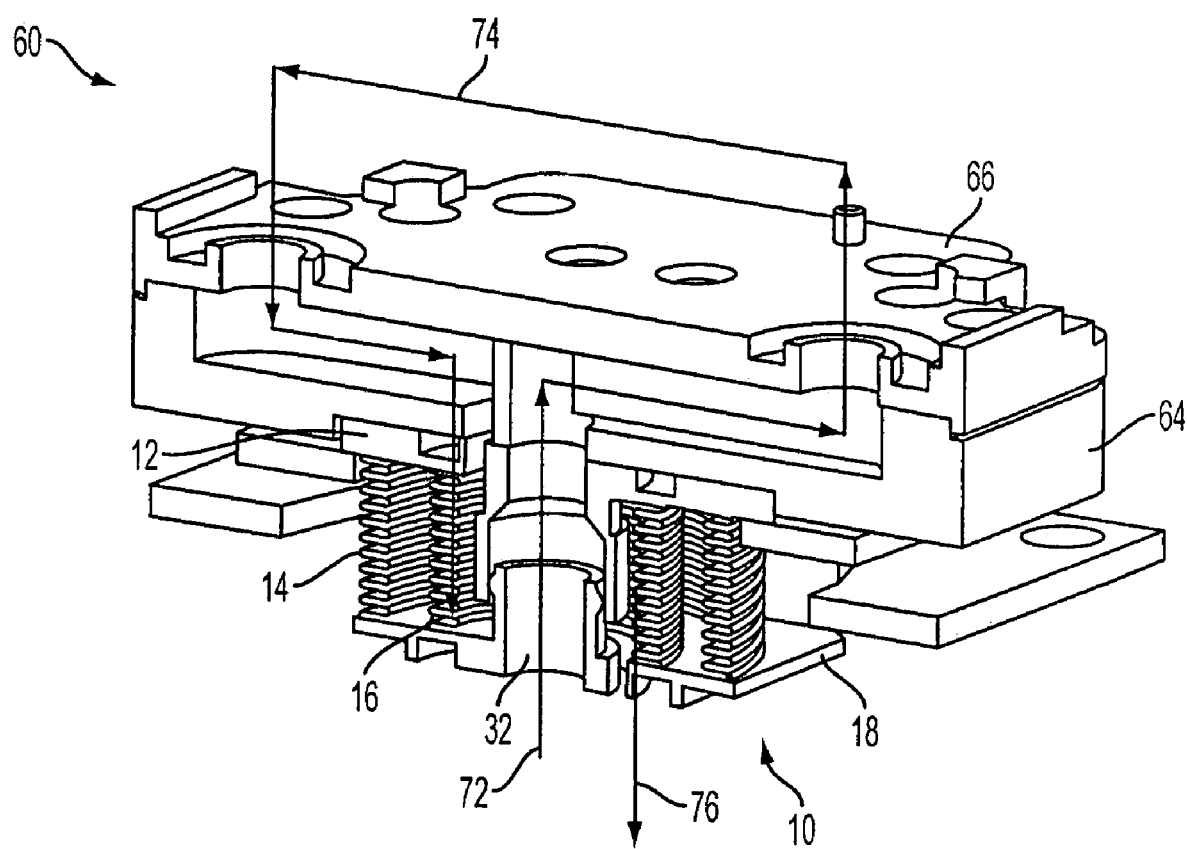
FIG. 8 shows a perspective view of a portion of a semiconductor device test assembly including a bellows assembly in accordance with an embodiment of the present invention.

FIG. 7 shows a perspective view of a portion of a semiconductor device test assembly 60 in accordance with an embodiment of the present invention. FIG. 8 shows a perspective view of a portion of the semiconductor device test assembly 60 including the bellows assembly 10 in accordance with an embodiment of the present invention. FIGS. 7 and 8 illustrate a fluid flow (refer to arrows) through the semiconductor device test assembly 60, where the semiconductor device test assembly 60 includes one or more of the bellows assembly 10. More specifically, with reference to FIGS. 7 and 8, a thermal medium or fluid enters a lower ultem base 62 of the semiconductor device test assembly 60, as indicated by arrow 70, and travels through the central fluid channel 32 in the inner bellow 16 of each of the one or more bellows assembly 10, as indicated by arrow 72. The fluid then travels across the heat sink 69 (refer to FIG. 10) as indicated by the arrow 74, where the heat sink 69 can include a first portion 64, a second portion 66, and a third portion 68 (refer to FIG. 10), and the heat sink 69 along with a heater 94 (refer to FIG. 10) can form a thermal unit. The fluid returns through the outer bellow 14 or through a space between the inner bellow 16 and the central fluid channel 32 back into the lower ultem base 62, as indicated by the arrow 76, and then flows out of the semiconductor device test assembly 60, as indicated by the arrow 78.

Thus, as is illustrated in FIGS. 7 and 8, the thermal medium or fluid can enter the lower ultem base 62, which can be an epoxied lower ultem base, and flow through the central fluid channel 32, which can be in the center of the bellows assembly 10, and then flow into the first portion 64 of the heat sink 69, which can be an upper ultem base. The fluid can then travel across a thermal unit, such as a thermal unit that includes the heater 94 and heat sink 69, and then return through the outer bellow 14 or through the space between the inner bellow 16 and the central fluid channel 32, back to the lower ultem base 62 and out of a chuck of the semiconductor device test assembly 60.

Figure 9:
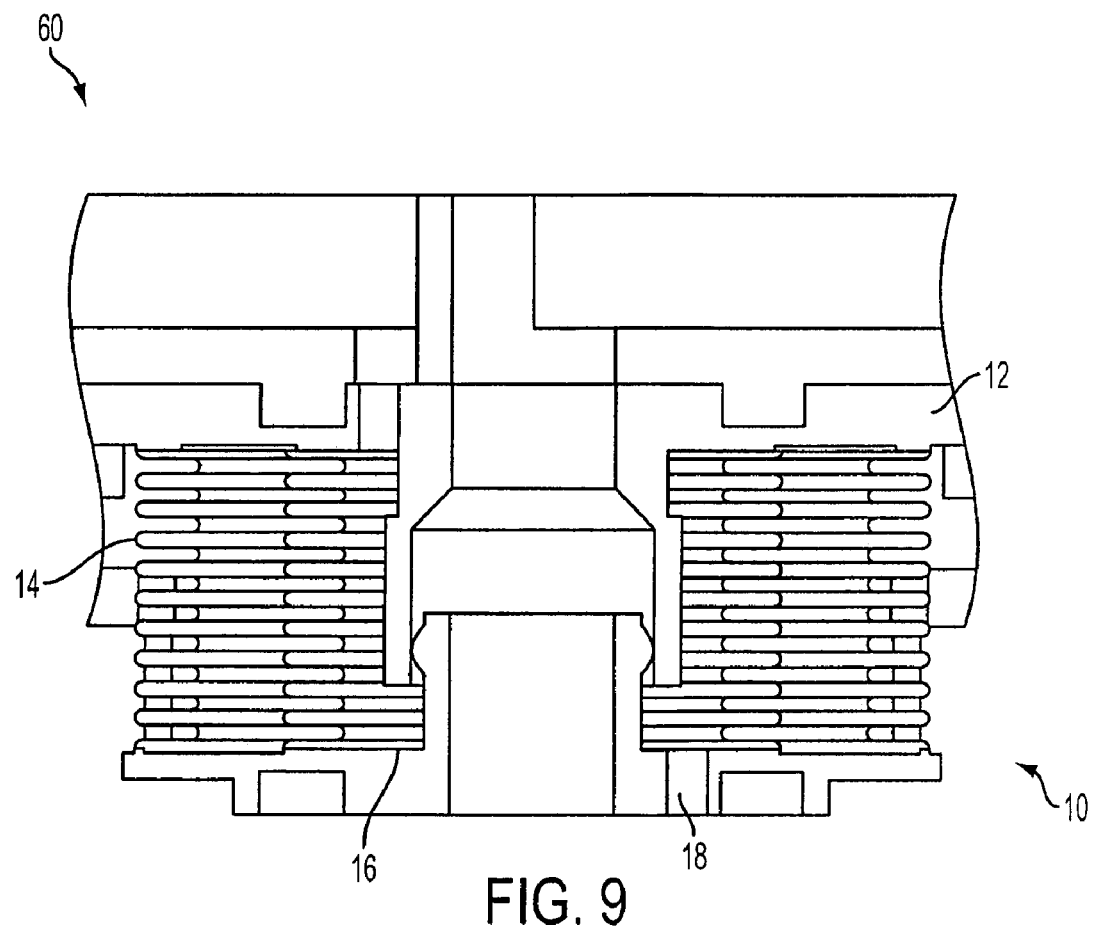
FIG. 9 shows a sectional view of a semiconductor device test assembly including a bellows assembly in accordance with an embodiment of the present invention.

FIG. 9 shows a sectional view of the semiconductor device test assembly 60 including the bellows assembly 10 in accordance with an embodiment of the present invention. Forces generated by a spring force of the inner bellow 16 and the outer bellow 14, a force generated by a chilled fluid force through the inner bellow 16, and a force generated by an air pressure in the outer bellow 14 are preferably centered on the heat sink 69 (refer to FIG. 10), and by extension, the thermal unit that includes the heat sink 69 and the heater 94. The centering of these forces on the heat sink 69 makes the heat sink 69 more balanced.

In various embodiments, an external influence to a gimbaling of a thermal unit that includes the heater 94 (refer to FIG. 10) and heat sink 69 is minimized. A thermal unit resistance to gimbaling can be based on hoses, load transfer assemblies, gimbal springs, and the like. In some embodiments, not only are external influences to the gimbaling minimized, but all influences can be centered on the thermal unit to reduce any balance act between springs. Thus, in some embodiments, a bellows spring force, a chiller fluid force through the bellows assembly 10, an air pressure from a die pressure bellows, and the like, are all centered on the thermal unit. In various embodiments, gimbaling can be limited to 0.070" of bellows compression. In such embodiments, actual usable compression can be around 0.050" because of thermal unit preload. In some embodiments, an angular deflection of the thermal unit is limited by a gap between the top bellow plate 12 and the bottom bellow plate 18.

Figure 10:
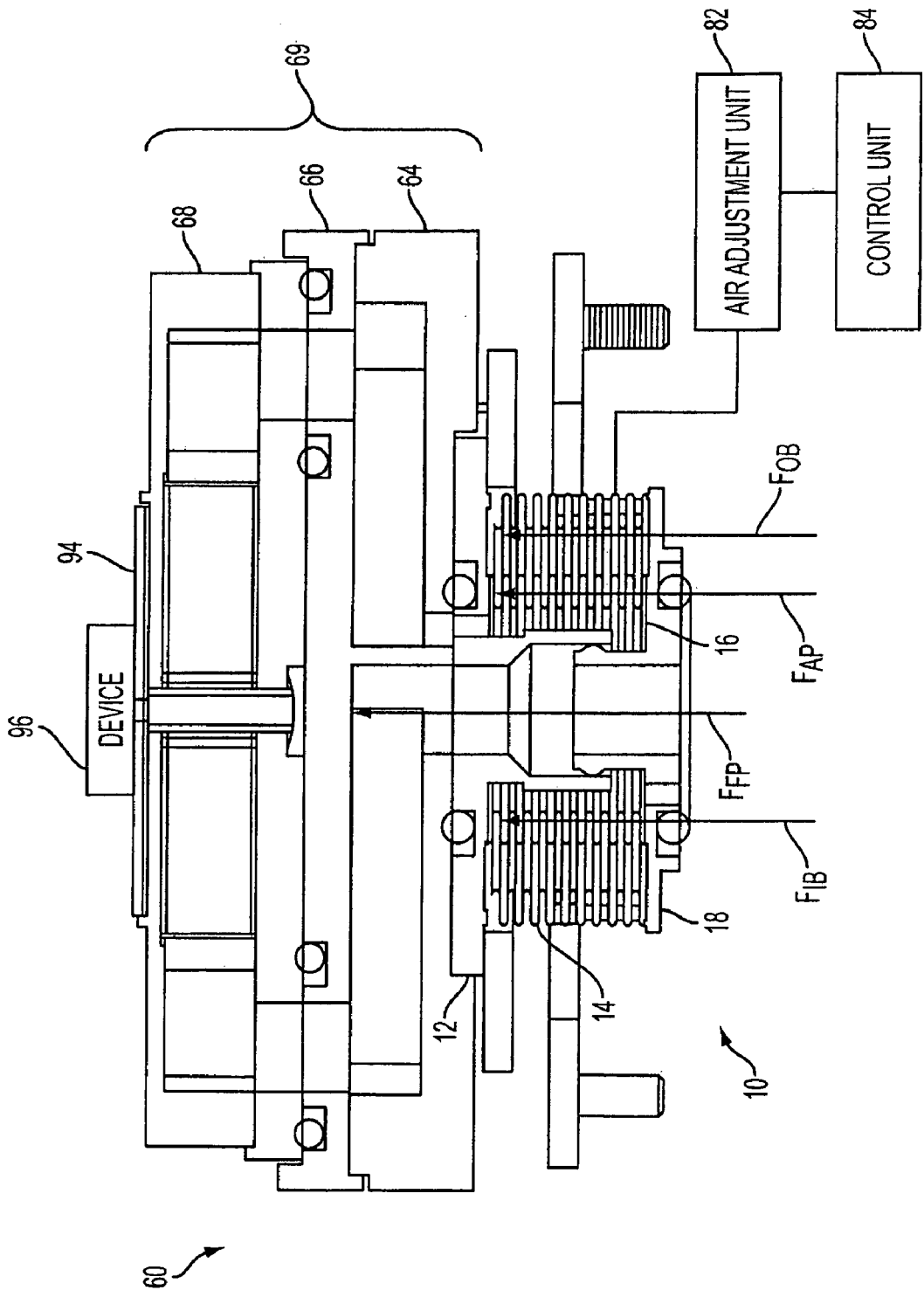
FIG. 10 shows another sectional view of a semiconductor device test assembly including a bellows assembly in accordance with an embodiment of the present invention.

FIG. 10 shows another sectional view of the semiconductor device test assembly 60 including the bellows assembly 10 in accordance with an embodiment of the present invention. More specifically, FIG. 10 shows graphically locations of the forces contributing to a contact force (i.e., the die force) on a device 96 to be tested that is supported by the heat sink 69 of the semiconductor device test assembly 60. The device 96 to be tested can be, for example, a semiconductor device, a computer chip, a die, or the like.

As shown in FIG. 10, an actual contact force results from a combination of a force from the fluid pressure indicated by the arrow labeled $F_{FP}$, a force from the inner bellow compression indicated by the arrow labeled $F_{IB}$, a force from the outer bellow compression indicated by the arrow labeled $F_{OB}$, and forces from the air pressure within the outer bellow 14 indicated by the arrow labeled $F_{AP}$. The force from the fluid pressure is derived from an area of the inner bellow 16 and the fluid pressure flowing to the heat sink 69. The forces from the inner bellow 16 and the outer bellow 14 are derived from their respective compressions and spring rates. The force from the air pressure in the outer bellow 14 is derived from a difference between the areas of the outer bellow 14 and the inner bellow 16 and the air pressure within the outer bellow 14.

In various embodiments, the device 96 comprises a die, and a die force or contact force is a sum of all of the forces acting on the die. In some embodiments, the force from fluid pressure ($F_{FP}$) is equal to an area of the inner bellows 16 multiplied by the fluid pressure. In some embodiments, a force from the inner bellow compression ($F_{IB}$) is equal to the compression of the inner bellow 16 multiplied by the spring rate of the inner bellow 16. In various embodiments, a force from outer bellow compression ($F_{OB}$) is equal to the compression of the outer bellow 14 multiplied by the spring rate of the outer bellow 14. Also, in various embodiments, a force from the air pressure within the outer bellow ($F_{AP}$) is equal to the result of [(outer bellow area−inner bellow area)*(air pressure)].

To adjust the contact force, the air pressure within the outer bellow 14 is adjusted. At a beginning of operation or testing, the air pressure within the outer bellow 14 is preferably zero. If a required or desired contact force is less than the actual contact force with zero air pressure, then a vacuum can be applied to the outer bellow 14 to reduce the air pressure, which correspondingly reduces the force from the air pressure. Conversely, if the desired contact force is more than the actual force with zero air pressure, then air is added to the outer bellow 14 to increase the air pressure, which correspondingly increases the force from the air pressure.

The outer bellow 14 is preferably coupled to an air adjustment unit 82 of the semiconductor device test assembly 60 that increases or decreases the air pressure in the outer bellow 14 in accordance with a comparison of the actual contact force to the desired contact force. The air adjustment unit 82 can be controlled by a control unit 84 of the semiconductor device test assembly 60 that detects the desired and actual contact forces and provides a control signal to the air adjustment unit 82 in accordance with the relative levels of the desired and actual contact forces. The control unit 84 can be implemented in hardware, such as an ASIC, in software, such as an application running on a computer, or some combination thereof. In some embodiments, there can be a limit to a minimum contact pressure achievable with using only the vacuum force pressure if, for example, a maximum vacuum is only approximately 12 psi.

Figure 11:
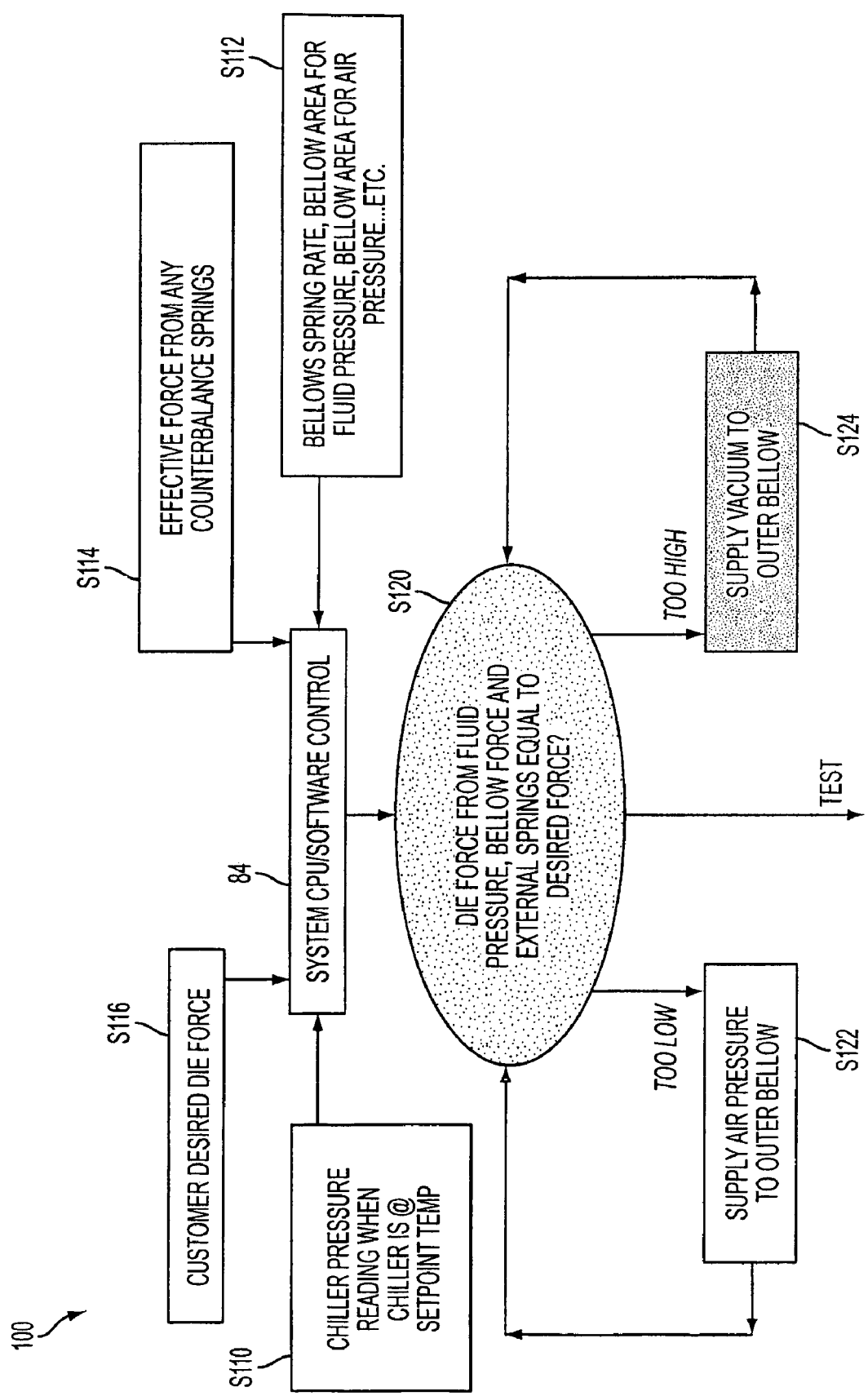
FIG. 11 is a combination block diagram and flow diagram for a contact pressure control system for a semiconductor device test assembly in accordance with an embodiment of the present invention.

FIG. 11 is a combination block diagram and flow diagram for a contact pressure control system 100 for the semiconductor device test assembly 60 in accordance with an embodiment of the present invention. As shown in FIG. 11, the control unit 84 can include a combination of a system CPU and software for controlling the contact force between the heat sink 69 and the device under test 96 (refer to FIG. 10). The control unit 84 is configured to calculate an actual contact force between the heat sink 69 and the device under test 96. To do so, the control unit 84 receives information regarding a fluid (chiller) pressure in S110, an air pressure in the outer bellow 14 (refer to FIG. 10), areas of the outer bellow 14 and the inner bellow 16, and spring rates for the outer bellow 14 and the inner bellow 16 in S112, and an effective force from any counterbalance springs in S114. The control unit 84 uses this information to calculate the actual contact force. The control unit 84 also receives information regarding a desired contact force in S116. The desired contact force can be entered through an interface (not shown) to the control unit 84, such as a keyboard, a touch screen, or the like.

During operation, the control unit 84 adjusts the air pressure in the outer bellow 14 (refer to FIG. 10) to adjust the actual contact force so that it coincides with the desired contact force. If it is determined in S120 that the desired contact force is greater than the actual contact force, then the control unit 84 increases the air pressure in the outer bellow 14 in S122. On the other hand, if it is determined in S120 that the desired contact force is less than the actual contact force, then the control unit 84 decreases the air pressure in the outer bellow 14 in S124. To adjust the air pressure in the outer bellow 14, the control unit 84 can send a control signal to the air adjustment unit 82 (refer to FIG. 10), which adjusts the air pressure in the outer bellow 14 in accordance with the control signal.

Figure 12:
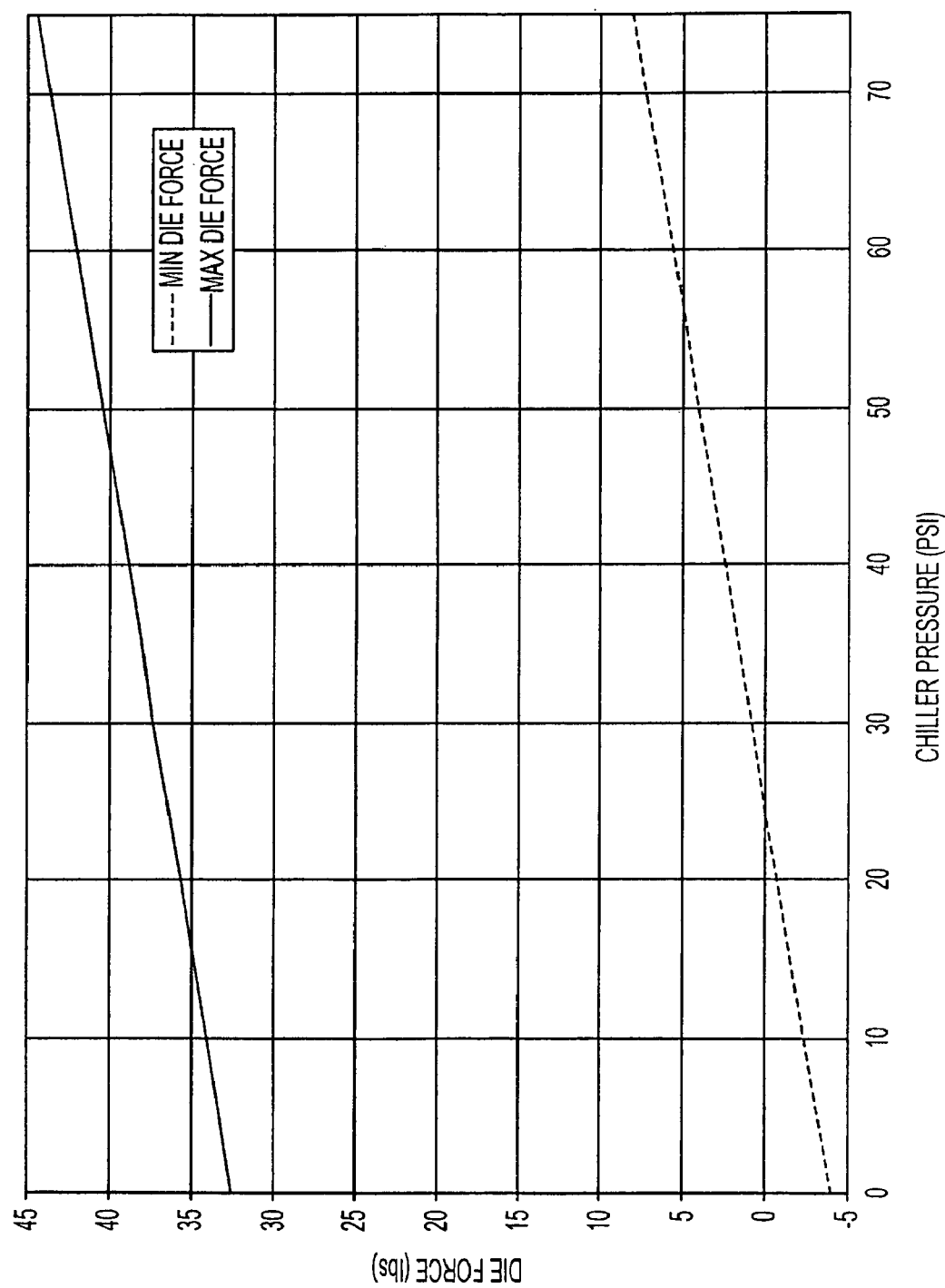
FIG. 12 shows an example of a graph of die (contact) force versus chiller (fluid) pressure in accordance with an embodiment of the present invention.

FIG. 12 shows an example of a graph of die (contact) force versus chiller (fluid) pressure in accordance with an embodiment of the present invention. As shown in FIG. 12, as the chiller pressure increases, the corresponding minimum and maximum contact forces also increase. In addition, a difference between the minimum and maximum contact forces remains substantially constant in the entire range of chiller pressures.

The semiconductor device test assembly 60 (refer to FIG. 10) is preferably configured to test the device 96 at one or more set point temperatures. During testing, the device 96 is placed on a surface of the heat sink 69 or on a surface of the heater 94. The heat sink 69 has a chilled fluid that flows through heat sink 69 and the bellows assembly 10. The heat sink 69 serves to transfer heat to and from the device 96 under test and to maintain the device 96 under test at a set point temperature during the test. The flow of the chilled fluid can be adjusted to control an amount of heat transfer between the heat sink 69 and the device 96 under test. The heating element or heater 94 allows for increasing a range of set points at which the device 96 can be tested.

In accordance with embodiments of the present invention, a semiconductor device testing assembly has a system for adjusting and controlling a contact force applied between a heat sink and a device under test. The assembly preferably provides a thermal medium path that can be centered on the heat sink, which nullifies or significantly reduces an influence on the compliance of the contact force provided by the assembly. In particular, there can be little bypass of the thermal medium, i.e., the substance used to flow through the heat sink to transfer heat to and from the device under test, from an inlet to an exit on the assembly. In addition, the assembly preferably includes a design for controlling the contact force between the heat sink and the device under test with a compressible medium in the assembly. The compressible medium can be, for example, pressurized air that is added to increase the contact force or that is vacuum pulled to decrease the contact force. The force can be actively controlled or set to a certain pressure.

The thermal medium path is preferably implemented in a bellows assembly of the semiconductor device testing assembly. More preferably, both the inlet and exit of the thermal medium occur within the same bellow, but are separated by other mechanical components that do not impact the compliance of the assembly. In addition, the bellows assembly can also separately contain the compressible medium used for controlling the contact force. A bellows assembly provides a useful design because of its 360 degrees of compliance and compression ability, although other designs for containing the thermal medium path and the contact force controlling medium are also possible.

In one embodiment, a chiller fluid is fed to the heat sink through the bellows assembly. More specifically, the chiller fluid is preferably fed through an inner bellow of the bellows assembly. The chiller pressure provides a certain amount of contact force between the heat sink and the device under test. If the user wants more contact force, air is provided to an outer bellow, which provides the extra force. If the user wants less contact force, air is vacuumed out of the outer bellow, which reduces the contact force. The outer bellow is preferably concentric with the inner bellow. In such an arrangement, the outer bellow preferably prevents frosting on inner fluid channels by supplying clean dry air to an area around the inner fluid channels for cold applications.

A user may also want to have a certain force during part of an operation or test, and may want to have a different force for another part of the operation. To control the contact force, the semiconductor device testing assembly, including the bellows assembly, can be controlled by a control system that automatically adjusts the air provided to or vacuumed from the outer bellow to achieve the desired contact force.

A size of the bellows can be increased or decreased. For example, a size of the outer bellow can be increased to provide for an increased volume between the outer bellow and the inner bellow. The increased volume allows for a greater variance in the amount of air that can be provided to or vacuumed out of the outer bellow, and thus increases a range in which the contact force can be adjusted. The bellows can also be made from a variety of materials, such as stainless steel, rubber, or the like. The material used for the bellows is preferably compressible and the material for at least the inner bellow is preferably designed to tolerate the thermal medium provided to the heat sink.

Furthermore, even if the bellows assembly is not configured to provide a thermal carrying medium, such as by the inner bellow, the bellows assembly can be used to provide the contact force adjustment by adjusting the air present in the space between the outer and inner bellows. The semiconductor device testing assembly can also include multiple bellows assemblies so that multiple devices can be tested simultaneously with contact force control available for each device under test.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments (which can be practiced separately or in combination) were chosen and described in order to explain the principles of the invention and as practical application to enable one skilled in the art to utilize the invention in various embodiments and with various modifications that are suited to the particular use contemplated. It is intended that the scope of the invention be defined by the claims appended hereto and their equivalents.

What is claimed is:

1. A semiconductor device test assembly, comprising:
a heat sink having a surface configured to support a device under test and to provide heat transfer using a thermal medium;
an inner bellow, having an inner surface and an outer surface;

an outer bellow at least partially surrounding the inner bellow, the outer bellow having an inner surface and an outer surface;

a control unit for detecting a contact force between the heat sink and the device under test and adjusting the contact force between the heat sink and the device under test; and a thermal medium path, wherein both the inlet and exit of the thermal medium path are defined by one of the inner bellow or the outer surface of the inner bellow and the inner surface of the outer bellow and provide heat transfer through the thermal medium.

2. The semiconductor device test assembly according to claim 1, wherein the control unit further comprises:

a system CPU; and a memory having software for controlling the contact force between the heat sink and the device under test.

3. The semiconductor device test assembly according to claim 2, further comprising:

an air adjustment unit for adjusting an air pressure in the outer bellow, wherein the air adjustment unit is configured to adjust the air pressure in the outer bellow in accordance with a control signal from the control unit.

4. The semiconductor device test assembly according to claim 3, wherein the control unit is configured to generate the control signal to control the air adjustment unit to increase or decrease the air pressure in the outer bellow.

5. The semiconductor device test assembly according to claim 3, wherein an increase in the air pressure in the outer bellow increases the contact force between the heat sink and the device under test; and wherein a decrease in the air pressure in the outer bellow decreases the contact force between the heat sink and the device under test.

6. The semiconductor device test assembly according to claim 1, wherein the inner bellow and the outer bellow are formed of a compressible material.

7. The semiconductor device test assembly according to claim 1, wherein the outer bellow and the inner bellow are concentric.

8. The semiconductor device test assembly according to claim 1, further comprising:

a heater interposed between the heat sink and the device under test;

wherein the device under test is in contact with a surface of the heater.

9. The semiconductor device test assembly according to claim 1, wherein the device under test is in contact with the surface of the heat sink.

10. The semiconductor device test assembly according to claim 1, further comprising:

a bottom bellow plate soldered to the inner bellow;

wherein the bottom bellow plate includes a cutout for capturing solder.

11. The semiconductor device test assembly according to claim 1, further comprising:

a bottom bellow plate;

a top bellow plate, a central fluid channel within the inner bellow and between the bottom bellow plate and top bellow plate, and wherein the inlet and exit of the thermal medium occur within the inner bellow.

12. The semiconductor device test assembly according to claim 11, wherein there is a space between the inner bellow and the fluid channel; and wherein the heat sink is configured such that, when the fluid exits from the heat sink, the fluid enters the space between the inner bellow and the central fluid channel.

13. The semiconductor device test assembly according to claim 11, wherein the bottom bellow plate further comprises a bypass limiting nub to integrally connect to a bypass limiting nub of the top bellow plate to form the central fluid channel.

14. The semiconductor device assembly according to claim 1, further comprising:

multiple bellows assemblies; and multiple devices under test, wherein the additional bellows assemblies provide simultaneous contact force control for each device under test.

15. The semiconductor device test assembly according to claim 1, wherein the control unit is configured to receive:

information regarding:

a fluid pressure, an air pressure in the outer bellow and the inner bellow, spring rates for the outer bellow and the inner bellow, and an effective force from counterbalance springs, to detect a contact force between the heat sink and the device under test.

16. A semiconductor device test assembly, comprising:

a heat sink having a surface configured to support a device under test;

an inner bellow;

an outer bellow at least partially surrounding the inner bellow;

a fluid channel within the inner bellow for providing a fluid to the heat sink;

a control unit for adjusting a contact force between the heat sink and the device under test; and an air adjustment unit for adjusting an air pressure in the outer bellow;

wherein the air adjustment unit is configured to adjust the air pressure in the outer bellow in accordance with a control signal from the control unit.

17. The semiconductor device test assembly according to claim 16, wherein the control unit is configured to generate the control signal to control the air adjustment unit to increase or decrease the air pressure in the outer bellow.

18. The semiconductor device test assembly according to claim 16, wherein an increase in the air pressure in the outer bellow increases the contact force between the heat sink and the device under test; and wherein a decrease in the air pressure in the outer bellow decreases the contact force between the heat sink and the device under test.

19. The semiconductor device test assembly according to claim 16, wherein the inlet and exit of the fluid occur within the inner bellow.

20. The semiconductor device test assembly according to claim 16, further comprising a heater, wherein the heat sink and the heater form a thermal unit resistant to gimbaling forces.

21. The semiconductor device assembly according to claim 16, further comprising:
   multiple bellows assemblies; and
   multiple devices under test,
      wherein the additional bellows assemblies provide simultaneous contact force control for each device under test.

22. The semiconductor device assembly according to claim 16, wherein the fluid within the inner bellow is air and adjusting the air present in the outer and inner bellows adjusts the contact force between the heat sink and the device under test.

23. In a semiconductor device test assembly comprising a heat sink having a surface configured to support a device under test, an inner bellow, an outer bellow at least partially surrounding the inner bellow, and a fluid channel within the inner bellow for providing a fluid to the heat sink, a method for controlling a contact force between the heat sink and the device under test, the method comprising:
   receiving an indication of a desired contact force between the heat sink and the device under test;
   detecting an actual contact force between the heat sink and the device under test;
   increasing an air pressure in the outer bellow if the desired contact force is greater than the actual contact force; and
   decreasing the air pressure in the outer bellow if the desired contact force is less than the actual contact force.

24. The method according to claim 23, wherein the step of detecting the actual contact force, comprises:
   detecting a fluid pressure component based on a fluid pressure provided by a fluid flow in the fluid channel;
   detecting an inner bellow pressure component based on a compression force of the inner bellow and a spring rate of the inner bellow;
   detecting an outer bellow pressure component based on a compression force of the outer bellow and a spring rate of the outer bellow;
   detecting an air pressure component based on the air pressure in the outer bellow; and
   calculating the actual contact force based on the fluid pressure component, the inner bellow pressure component, the outer bellow pressure component, and the air pressure component.

25. The method according to claim 23, further comprising:
   centering all forces acting within the semiconductor device test assembly on a thermal unit comprising the heat sink, a heater, or both.

26. The method according to claim 23, further comprising:
   adjusting the flow of the chilled fluid through the inner bellow to control the amount of heat transfer between the heat sink and device under test.

27. The method according to claim 23, further comprising:
   automatically adjusting the contact force between the heat sink and the device under test by a control system input.

* * * * *